Figure 1:
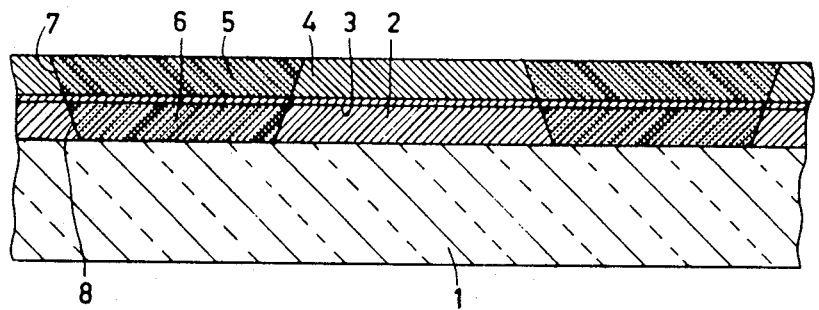

United States Patent [19]

Wijdenes et al.

[11] Patent Number: 4,861,699

[45] Date of Patent: Aug. 29, 1989

[54] METHOD OF MAKING A MASTER DISK USED IN MAKING OPTICAL READABLE INFORMATION DISKS

[75] Inventors: Jacob Wijdenes; Johannes M. Ramaker; Cornelis Weening, all of Eindhoven, Netherlands

[73] Assignee: U.S. Philips Corporation, New York, N.Y.

[21] Appl. No.: 802,934

[22] Filed: Nov. 26, 1985

Related U.S. Application Data

[63] Continuation of Ser. No. 536,145, Sep. 28, 1983, abandoned.

[30] Foreign Application Priority Data

Mar. 16, 1983 [NL] Netherlands ......................... 8300948

[51] Int. Cl.[4] ......................... G03C 5/00; G03F 7/26; G11B 11/03
[52] U.S. Cl. ................................. 430/321; 430/156; 430/312; 430/314; 430/320; 430/326; 430/945; 346/76 L; 346/135.1; 346/137; 369/94; 369/275; 369/286; 369/288; 503/201
[58] Field of Search ............... 430/321, 320, 312, 156, 430/314, 326, 945; 346/76 L, 135.1, 137, 1; 369/275, 286, 288, 94

[56] References Cited

U.S. PATENT DOCUMENTS

| | | | |
|---|---|---|---|
| 3,313,626 | 4/1967 | Whitney | 430/156 |
| 3,849,136 | 11/1974 | Grebe | 430/314 |
| 3,902,010 | 8/1975 | Goshima | 369/125 |
| 3,982,943 | 9/1976 | Feng et al. | 430/314 |
| 4,090,031 | 5/1978 | Russell | 369/94 |
| 4,102,683 | 7/1968 | DiPiazza | 430/319 |
| 4,150,398 | 4/1979 | Kojima et al. | 430/326 |
| 4,275,091 | 6/1981 | Lippits et al. | 427/53.1 |
| 4,298,975 | 11/1981 | van der Veel et al. | 369/94 |
| 4,310,919 | 1/1982 | Slaten | 346/135.1 |
| 4,325,135 | 4/1982 | Dil et al. | 369/94 |
| 4,385,372 | 5/1983 | Drexler | 369/275 |
| 4,394,438 | 7/1983 | Van Pelt et al. | 430/321 |
| 4,394,661 | 7/1983 | Pecters | 430/945 |
| 4,423,502 | 12/1983 | Dil | 369/275 |
| 4,450,553 | 5/1984 | Holster et al. | 346/135.1 |
| 4,550,395 | 10/1985 | Carlson | 369/94 |

FOREIGN PATENT DOCUMENTS 2742976  3/1978  Fed. Rep. of Germany ........ 369/94

Primary Examiner—Charles L. Bowers, Jr.
Attorney, Agent, or Firm—Algy Tamoshunas; Leroy Eason

[57] ABSTRACT

A method of manufacturing an optical master disk, matrix derived from the master disk and synthetic resin information disk derived from the matrix.

A method of manufacturing an optical master disk in which a supporting plate is provided on one side with at least two layers of a photosensitive material in which, taken from the supporting plate, the photosensitivity of the material of the layers increases and/or in which a light-absorbing separation layer is used between the layers, as well as a metal matrix derived from the master disk and an optically readable information disk of synthetic resin derived from the matrix.

5 Claims, 2 Drawing Sheets

METHOD OF MAKING A MASTER DISK USED IN MAKING OPTICAL READABLE INFORMATION DISKS

This is a continuation of application Ser. No. 535,145, Filed Sept. 28, 1983, now abandoned.

The invention relates to a method of manufacturing an optical master disk which comprises at least two optical structures situated at different levels.

Such a method is known from Japanese Patent Publication 56-169235. According to the known method, a layer of a photosensitive material is provided on a glass supporting plate and is then exposed to laser light. After development a first optical structure, sometimes termed guide track, is formed in the layer of photosensitive material, which structure has the form of a groove the depth of which corresponds to the thickness of the layer of photosensitive material. A layer of photosensitive material will hereinafter also be referred to as photoresist layer. The layer thickness is $\frac{1}{8} \lambda$, where $\lambda$ is the wavelength of the laser light used. A second photoresist layer, also in a thickness of $\frac{1}{8} \lambda$, is then provided over the developed first photoresist layer comprising the groove. At the area of the groove the photoresist material has a thickness of one layer and beside the groove it has a thickness of two layers. The photoresist layer present in the groove is then exposed imagewise and the photosensitive material is again developed. Holes which extend down to the supporting plate are formed locally in the photosensitive material present in the groove. The holes or recesses constitute a second optical structure which comprises optically readable information.

The method known from the Japanese Patent Publication has the disadvantage of being cumbersome and consequently expensive. As a result of the several process steps, errors can easily arise which adversely influence the quantity of the resulting master disk.

It is an object of the invention to provide a method which does not exhibit the above-mentioned disadvantages. The method according to the invention is simple, has comparatively few process steps and yields excellent results.

Another object of the invention is to provide a method in which a master disk can be manufactured in a simple manner which comprises more than one, for example two, optically readable information tracks each situated at a different level.

Still another object of the invention is to provide metal dies which are copies of the said master disk and have at least two optically readable information tracks situated at different levels.

According to a further object, optically readable information disks of synthetic resin are provided which are copies of the above-mentioned die and have at least two optically readable information tracks situated at different levels.

The invention relates more in particular to a method as described in the opening paragraph which is characterized in that a supporting plate is provided on one side with at least two layers of photosensitive material in which, taken from the supporting plate, the photosensitivity of the layers increases and/or in which a light-absorbing separating layer is provided between the layers of photosensitive material, the photosensitive material is exposed to laser light of different intensity levels and is then developed, at least two optical structures which are situated at different levels being formed in the photosensitive material.

When using the method according to the invention the photosensitive material is exposed from the air (air incident) to laser light of different intensity levels and is then developed. The invention is based on the principle that, taken from the supporting plate, the effective photosensitivity of the layers of photosensitive material increases. Effective photosensitivity is to be understood to mean herein the quantity of laser light energy per unit of surface which is necessary to convert, upon air incident exposure, the same quantity of the photosensitive material in different photoresist layers. Positive photoresist materials are used so that upon development the material converted as a result of the exposure dissolves. The stepwise difference in effective photosensitivity between the various photoresist layers is an important factor in the method according to the invention. As a result of this it is achieved that the optical structures obtained by exposure and development, whereby each structure is provided in a different photoresist layer, have a very readily defined shape. For example, an optical structure in the form of a groove has a readily defined bottom configuration and a readily defined angle of inclination of the upright wall parts. This good geometrical definition of the structure is of essential importance for the quality of the stored information. It is also achieved that the amount of laser light energy necessary to convert the photosensitive material in the various photoresist layers, increases stepwise taken from the outermost layer (top layer) of photoresist material down to the layer of photoresist material adjoining the supporting plate. As a result of this the exposure step is less critical.

The difference in effective photosensitivity can be achieved by causing the photosensitivity of the various layers to increase taken from the supporting plate. The top layer comprises photoresist material having the highest photosensitivity. The inner layer adjoining the supporting plate has the lowest photosensitivity.

However, the use of light-absorbing separation layers provided between the photoresist layers is to be preferred. As a result of this, in the case of air incident exposure, the effective photosensitivity of a photoresist layer present below a separation layer is reduced with respect to a photoresist layer present above the separation layer because with air incident exposure the photoresist layer present below the separation layer receives less laser light energy. The separation layer must be partly transparent and, for example, still have a light transmission of 10-90% in accordance with the desired difference in effective photosensitivity of the various photoresist layers. The use of a separation layer operating as a light barrier presents the advantage that the geometrical definition of the resulting optical structure is considerably improved. Another advantage of a separation layer is that the possibility that the photoresist layers partly dissolve one in the other is prevented. When a separation layer is used, the photosensitivity of the resist material which is provided below a separation layer may be equal, smaller than or larger than that of the photoresist material which is present above a separation layer. The effective photosensitivity of a sub-layer must be smaller than that of a photoresist layer present above the separation layer, taken from the top layer.

A favourable embodiment of the method according to the invention is characterized in that on one side the supporting plate is provided with two layers of photosensitive material and a light-absorbing separation layer provided between the layers, the photosensitive material is exposed to laser light of different intensity levels and is then developed in which, as a result of the exposure to laser light of a low intensity level, an optical guide track in the form of a groove having a depth which corresponds to the thickness of the top layer is formed in the top layer of photosensitive material remote from the supporting plate, and, as a result of the exposure to laser light of a high intensity level, the groove is locally provided with recessed portions extending in the sub-layer of the photosensitive material and forming an optically readable information structure.

The recessed portions of the groove form an optically readable information structure of information areas situated alternately at a higher level and at a lower level. The longitudinal dimensions of the areas vary in accordance with the stored information from 0.3 to 30/μm. The difference in height of the areas is λ/8n, where λ is the wavelength of the laser light with which the structure is read, and n is the refractive index. The depth of the groove is also λ/8n. That part of the groove which is provided with the information structure is termed heading. Normally, the informatrion structure is not provided over the entire length of the groove. So the heading is alternated by groove portions which are not provided with an information structure. The groove or guide track partially provided with said information structure is called hereinafter a signal track. Usually the information structure in the heading extends down to the supporting plate. It is to be noted that if, contrary to the invention, the photosensitive material is provided in one thick layer, both the heading and the groove, but specially the groove, have a poorly defined profile so that the track following or the reading of the information stored in the heading presents important problems and leads to errors.

Another favourable embodiment of the method in accordance with the invention is characterized in that the supporting plate is provided on one side with two layers of photosensitive material and a light-absorbing separation layer provided between the layers, the photosensitive material is exposed to modulated laser light of different intensity levels and is then developed in which, as a result of the exposure to modulated laser light of a low intensity level, a first optically readable information track of information areas situated alternately at a higher level and at a lower level is formed in the top layer of photosensitive material remote from the supporting plate, and, as a result of the exposure to modulated laser light of a high intensity level, a second optically readable information track of information areas situated alternately at a higher level and at a lower level is formed in the sub-layer of photosensitive material.

The two optically readable information tracks preferably have a spiral-like variation or may be built up from concentric circles. The spiral-like tracks extend parallel to each other. The information track may be a signal track as defined hereinbefore or a track fully provided—i.e. along its entire length—with information areas. In the latter case it is not required that the information areas arranged in the bottom part of a groove.

The separation layer may be manufactured from a metal or its oxide. Preferably, a metal layer in a thickness from 5-15 nm is used as a separation layer. Suitable metal layers are vapour-deposited or sputtered layers of, for example, Ag, Al, Cu, Au, Zn, SN, Cr or Fe. Alloys of metals may also be used. The metal layer may also be provided by means of a chemical deposition process in which the surface to be covered is treated simultaneously or successively with an aqueous solution of a metal salt, for example, an ammonical silver nitrate solution and an aqueous solution of a reduction agent, for example glucose.

The invention furthermore relates to a metal die suitable for use in the production of optically readable information disks of synthetic resin in which the die is a metal copy of the master disk obtained according to the method described hereinbefore and comprises at least two optical information tracks situated at different levels.

The metal die may be manufactured in any usual manner by first providing the master disk on the side of the photosensitive material comprising at least two optical information tracks with a metal layer by an electroless deposition process, the providing on the metal layer a further metal layer by electrodeposition (electrolytically) and finally removing the resulting metal peel in which the optical information tracks of the master disk are copied from the master disk. A suitable electroless deposition process is a vapour deposition process, a sputtering process or a chemical deposition process. According to this latter process aqueous solutions of a metal salt and of a reduction agent are simultaneously or successively spread or atomized on the surface to be metallized. A suitable metal layer provided by an electroless deposition process is an Al layer on which an Ni layer is provided by electrodeposition. The resulting negative metal copy is termed father die. The father die can be used for the production of copies of synthetic resin. Mostly from the father die a positive metal copy is made by electrodeposition, the so-called mother die, from which negative metal copies are manufactured again by electrodeposition. These latter dies are usually used in the manufacture of positive copies in synthetic resin.

The invention is also embodied in an optically readable information disk of synthetic resin in which the disk is a copy of the above-mentioned negative metal die and comprises at least two optical information tracks situated at different levels. The disks may be manufactured according to known methods, for example, a compression process, an injection moulding process or a compression moulding process. Especially suitable is an injection moulding process or a compression moulding process in which a liquid plastic synthetic resin, for example polycarbonate or polymethylmethacrylate, is compressed at elevated temperature and pressure in a mould which has one or two dies. After cooling and removing the pressure the mould is opened and the synthetic resin information disk in which the optical information tracks of the die are copied is removed.

Another suitable process in the so-called polymerization process known from the published Dutch patent application 7611395 corresponding to U.S. Pat. No. 4,275,091. The metal die thereby is provided with a liquid composition comprising monomers which can be polymerized for example by means of light. Upon the layer of monomers such as acrylates a transparent substrate plate is positioned. The monomers are irradiated f.e. by ultrasonic light through the substrate and the assembly of substrate and attached cured layer in which the information tracks of the die are copied, is removed from the die.

The resulting disk of synthetic resin is provided with a reflection layer of f.e. of Ag or Al on the side of the tracks, in case the tracks are fully provided with information areas. The ultimate disks may comprise sound information (audio disk) or image information (video disk).

The information tracks are read in reflection by means of laser light on the basis of phase differences between the forward beam and the reflected beam. The phase differences vary in accordance with whether an information area at a higher level or at a lower level is exposed to the laser light.

Information disks of synthetic resin having a signal track i.e. a guide track which locally comprises a heading, are covered on the side of the track with a reflective recording layer. This type of disks is known by the name of optical recording disks. A suitable reflective recording layer is a layer of tellurium or a tellurium-containing compound, for example, a mixture of Te, Se, As or Te, Se, Sb or Te, Se, Sb, S. The heading is read in reflection by means of weak laser light. The laser light energy is then increased and an information bit in the form of a cavity or hole is formed in the recording layer. The speed and place of recording is controlled by the information stored in the heading. Recording takes place preferably in the groove parts of the recording layer present between the headings. Instead of a recording layer of tellurium or a tellurium alloy a magneto-optical recording layer may also be used, for example, a cobalt-ferrite layer in which variation in the magnetization occurs in the exposed places. The information stored herein may be erased. The same applies to recording layers of chalogenides in which conversions from amorphous to crystalline and conversely takes place by exposure to laser light. Layers of dye may also be used which decompose in the exposed places and/or from a cavity.

Figure 2:
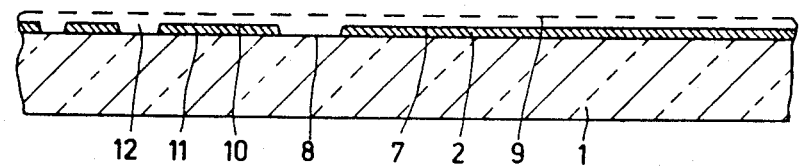
Figure 3:
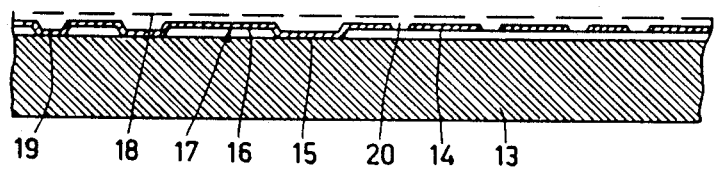
Figure 4:
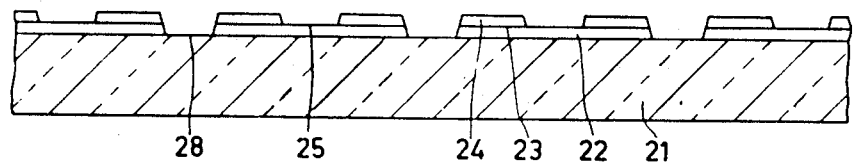
Figure 5:
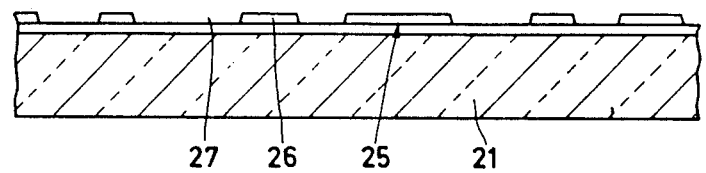
Figure 6:
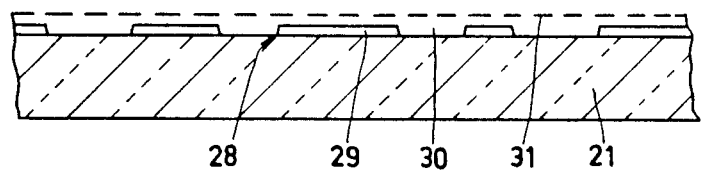
Figure 7:
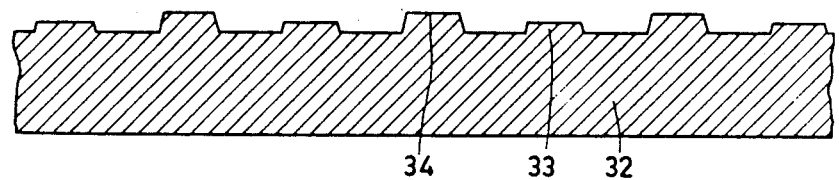
Figure 8:
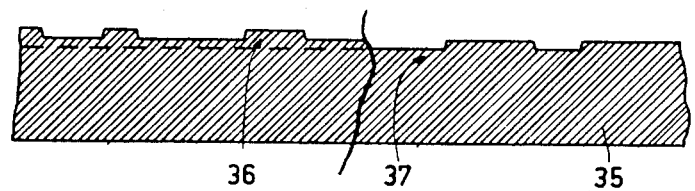

The invention will now be described in greater detail with reference to the drawing, in which FIG. 1 is a cross-sectional view of a photosensitive element used in the method according to the invention, FIG. 2 is a tangential sectional view of a master disk at the area of a groove, FIG. 3 is a tangential sectional view of an optical recording disk derived from the master disk according to FIG. 2, FIG. 4 is a cross-sectional view of a master disk, FIG. 5 is a first tangential sectional view of the master disk shown in FIG. 4, FIG. 6 is a second tangential sectional view of the master disk shown in FIG. 4, FIG. 7 is a cross-sectional view of a metal die derived from the master disk shown in FIG. 4, and FIG. 8 are two tangential cross-sectional views of a synthetic resin information carrier derived from the die shown in FIG. 7.

Reference numeral 1 in FIG. 1 denotes a glass supporting plate which has the form of a disk having a diameter of 356 mm and a thickness of 5.4 mm. On one side the supporting plate comprises a first layer of a positive photoresist. The photoresist used is a Novolak-naphthoquinone diazide composition which is known, for example, by the tradenames Shipley or Hunt Waycoat. Layer 2 has a thickness of 70 nm. A thin layer 3 of Al is vapour-deposited in a thickness of 10 nm on photoresist layer 2. The thin layer 3 of Al forms a light filter having a light absorption of approximately 50%. A second photoresist layer 4 is provided on layer 3. Photoresist layer 4 comprises the same photoresist material as layer 2, i.e. a photoresist of naphthoquinone diazide. Alternatively, the layer thickness is 80 nm. The thin layer 3 of Al may be omitted. In such a modified embodiment shown in FIG. 1, the photosensitivity of photoresist layer 2 must be lower than that of layer 4. A lower sensitivity can be achieved by using another photoresist material having a lower photosensitivity. A lower photosensitivity can also be obtained by subjecting the photoresist material of layer 2 to a thermal treatment. The extent of the reduction of the sensitivity depends on the duration of the thermal treatment and of the temperature level used. The extent of variation of the photosensitivity is recorded in the table below as a function of the temperature and treatment time. The photosensitivity is expressed as normalized exposure time. This is the ratio of the exposure time necessary to decompose the material which was subjected to a thermal treatment and to dissolve it in the developing liquid and the exposure time necessary to decompose and dissolve non-treated material.

TABLE

| Thermal treatment temperature in °C. | time in min. | Photosensitivity expressed in normalized exposure time |
|---|---|---|
| 100 | 10 | 1.1 |
| 100 | 20 | 1.2 |
| 100 | 30 | 1.2 |
| 100 | 40 | 1.2 |
| 100 | 50 | 1.3 |
| 100 | 60 | 1.3 |
| 100 | 70 | 1.4 |
| 100 | 80 | 1.5 |
| 100 | 90 | 1.5 |
| 110 | 10 | 1.1 |
| 110 | 20 | 1.2 |
| 110 | 30 | 1.6 |
| 110 | 40 | 2.4 |
| 110 | 50 | 3.5 |
| 110 | 60 | 10.0 |
| 120 | 10 | 1.6 |
| 120 | 20 | 5.0 |
| 120 | 40 | 10.0 |

The photosensitive element shown in FIG. 1 is exposed in the form of a pattern on the side of layer 4 to laser light originating from a laser having a power of 10 mW. The exposed surface is spiral-like. This is achieved by rotating the disk-shaped element of FIG. 1 and moving the laser light beam radially over the element. During certain periods of the exposure, the laser light is pulsed between the above-mentioned energy level of 10 mW and a higher energy level of 25 mW. The pulse time is variable and is, for example, between 20 and 100 ns. The photosensitive element is then developed in an alkaline developer suitable for this purpose, for example, an aqueous solution of NaOH and $Na_4P_2O_7 \cdot 10H_2O$. As a result of this the exposed parts of the photoresist layer 4 dissolve. The released Al-layer is etched away by means of a suitable aqueous solution of an acid, for example $HNO_3$, $H_3PO_4$ or mixtures thereof with acetic acid. The element is then treated again with the developing liquid, the exposed parts of layer 2 being dissolved.

The exposed parts are shown shaded in FIG. 1 in which the exposed parts of layer 4 are referred to by reference numeral 5 and those of layer 2 are referred to by reference number 6. As a result of the dissolution of the exposed parts, a spiral-like groove 7 is formed in the layer 4 in which recessed portions 8 are formed locally as a result of the above-mentioned exposure to laser light of a higher intensity level. These recessed portions 8 together with the intermediate portions of the groove 5 constitute an optically readable structure of information areas situated alternatively at a higher level and at a lower level.

This optical structure is shown in FIG. 2 which is a tangential sectional view of a master disk obtained after developing the element shown in FIG. 1 at the area of the groove. In FIG. 2 the same reference numerals are used in FIG. 1 for corresponding components. The surface of the master disk is indicated in FIG. 2 by a broken line 9. The groove 7 forms a first optically readable structure which serves as a guide track for a laser light beam. The groove locally comprises recessed portions 8 which together with the intermediate parts 10 of the groove constitute a second optically readable structure of information areas 11 situated at a higher level alternated by areas 12 situated at a lower level.

Metal copies are manufactured from the master disk in the usual manner. For this purpose, the master disk is first provided on the side of the resist layers with a metal layer, for example and Ag-layer, by electroless deposition, on which a thicker metal layer, for example an Ni-layer, is then provided electrolytically. The first negative metal copy is referred to as the father die or father matrix. A positive metal copy (mother die) is made from the father die and then again a negative metal copy (son die). The last die which is a negative of the master disk is usually used in the manufacture of positive replicas of synthetic resin which then have the same structure as the master disk.

The replica of synthetic resin is shown in FIG. 3. FIG. 3 is a tangential sectional view of the replica at the area of the groove, comparable to the sectional view of the master disk shown in FIG. 2.

Reference numeral 13 in FIG. 3 denotes a synthetic resin disk, for example, a polycarbonate or polymethylmethacrylate. The disk may be constructed from a glass plate which is covered by a layer of synthetic resin. The disk of synthetic resin comprises on one side a structure analogous to that of the master disk shown in FIG. 2. The structure comprises a groove 14 having recessed portions 15. The recessed portions 15 together with the intermediate portions 16 constitute an optically readable crenellated information track 17 (heading). The surface of the synthetic resin disk is denoted by the broken line 18. A recording layer 19 of, for example, a tellurium alloy is provided on the surface of the disk. The disk is scanned by means of weak laser light which follows the groove 14. The laser light is directed through the synthetic resin disk (substrate-incident) and is reflected by the recording layer 19. The information stored in the heading is read in reflection on the basis of phase differences. Information is recorded in the recording layer 19. For this purpose the recording layer is exposed to strong laser light which is modulated in accordance with the data to be recorded. In the exposed places the recording material melts and a cavity 20 is formed. Cavity 20 is an information bit which can be read optically by means of weak laser light. The place and speed of recording is controlled by the information present in the heading 17.

Reference numeral 21 in FIG. 4 denotes a supporting plate of glass having a diameter of 24 cm and a thickness of 5.4 mm. The disk comprises on one side, successively, a photoresist layer 22 having a thickness of 160 nm, an Al-layer 23 having a thickness of 10 nm and a second photoresist layer 24 having a thickness of 170 nm. The photoresist materials are the same as those described with reference to FIG. 1. The photoresist layers are exposed to modulated laser light of different intensity levels in such manner that after developing, two information tracks are formed. The first optically readable information track is referenced 25. This track is obtained by exposing layer 24 to laser light of a comparatively low intensity which is pulsed in accordance with the information to be provided in the track. The laser light beam is pulsed between an energy level 0 (no laser light) and an energy level of 20 mW. The pulse time is small and varies in accordance with the data to be recorded from 20 to 100 ns. As a result of this the information track 25 comprises information areas which are situated alternately at a higher level 26 and at a lower level 27 (FIG. 5). In FIG. 5 the same reference numerals are used for the same components as in FIG. 4.

The information areas of lower level 27 extend down to the Al-layer 23. The released parts of the Al-layer are etched away afterwards. The longitudinal dimensions of the areas vary in accordance with the stored information from approximately 0.3 to 30 $\mu$um. The difference in height (160 $\mu$m) is equal to $\lambda/4n$, where $\lambda$ is the wavelength of the laser light and n is the refractive index.

The second spiral-like optically readable information track is indicated by reference numeral 28. Track 28 has been obtained by exposing the photoresist layers 22, 24 to pulsated laser light of a comparatively high intensity level which originates from a laser which is pulsed between an energy level of 20 mW and an energy level of 50 mW. The pulse time varies from approximately 20 to 100 ns. The Al-layer is etched away. After development, an optically readable information track 28 is obtained, as is shown in particular in FIG. 6. In FIG. 6 the same reference numerals are used for the same components as in FIG. 4. The track 28 comprises information areas which are situated alternately at a higher level 29 and at a lower level 30. The longitudinal dimensions of the areas vary in accordance with the stored information from approximately 0.3 to 30 $\mu$um. The top surface of the areas of higher level 29 is formed by the etched-away Al-layer 23. The areas of lower level 30 extend down to the supporting plate 21. The surface of the master disk is indicated by the broken line 31.

The master plate shown in FIGS. 4 to 6 is provided by electroless deposition with a metal layer, for example, a vapour-deposited Ag-layer, and then with an electrolytically provided thick metal layer of, for example, Ni. The resulting negative metal copy (father die) is removed from the master disk. A positive metal copy (mother die) is manufactured from the father die by electrodeposition (electrolytically) and from it a negative metal son die is manufactured. Replicas of synthetic resin are manufactured by means of the son die.

FIG. 7 shows the son die. In this Figure, reference numeral 32 denotes an Ni-peel which on one side has optically readable information tracks 33 and 34.

The tracks 33 and 34 are the negative of the tracks 25 and 26 of the master disk shown in FIGS. 4 to 6. By means of the FIG. 7 die, a copy of synthetic resin is manufactured, for example, by using a known injection moulding process, transfer moulding process or compression process. The resulting optically readable synthetic resin disk is shown in FIG. 8. In this Figure, reference numeral 35 denotes a disk of synthetic resin manufactured, for example, from polycarbonate or polymethylmethacrylate. The disk comprises on one side two spiral-like information tracks 36 and 37. The higher track 36 which in FIG. 8 is shown on the left-hand side, is identical to track 25 (FIG. 5). The lower track 37 is identical to track 28 (FIG. 6). The disk of synthetic resin is coated on the side of the information tracks 36, 37 with a reflection layer of metal (not shown). The information tracks may comprise audio information or video information. The stored information is read in reflection by means of laser light which is focused on tracks 36 and 37 via disk 35.

What is claimed is:

1. A method of making a master disk used in manufacturing of optically readable information disks having at least two optical structures situated at different levels, said method comprising the steps of providing a first layer of photosensitive material on one side of a supporting plate, providing a separation layer on said first layer, providing a second photosensitive layer on said separation layer so as to form an assembly comprised of said plate having on one side thereof two superposed layers of said photosensitive material with said separation layer being disposed between said photosensitive layers, exposing said assembly with laser light of a first intensity sufficient to produce a change in said photosensitive material of said second layer and a second intensity level which is higher than said first intensity level, and developing said photosensitive material of said first and second layers, said separation layer being partly transparent to and being adapted to reduce the intensity of said laser light by an amount such that during exposure with said laser light of said first intensity level, the energy of said light reaching said first layer is insufficient to produce a change in said photosensitive material thereof, whereas during exposure with said laser light of said second intensity level, the energy of said light passing through said separation layer is sufficient to produce a change in said photosensitive material of said first layer, as well as in the photosensitive material of said second layer, so that upon development optical structures are formed in said first and second layers which are disposed at different levels with respect to said one side of said supporting plate.

2. The method according to claim 1 wherein said photosensitive material is a positive photoresist and said developing step includes removing portions of said photoresist which are exposed to said laser light during said exposing step.

3. The method according to claim 1 or 2 wherein during said exposing step said first and second layers are exposed with continuous laser light of said first intensity level and pulsed laser light of said second intensity level and producing relative movement between said laser light and said assembly during said exposing steps so that said laser light exposes an elongated portion of said first and second layers, said first intensity level being such that upon development, a groove is formed in said second layer of a depth which corresponds to the thickness of said second layer and said pulsed second intensity level being such that upon development, spaced apart recesses are formed in said first layer, said spaced apart recesses defining an optically readable information track which extends along at least a portion of said groove.

4. The method according to claim 1 or 2 wherein said separation layer is comprised of metal and has a thickness of 5 to 15 nm.

5. The method according to claim 1 or 2 including producing relative movement between said laser light and said assembly during said exposing step so as to expose an elongated portion of said first and second layers, and wherein said laser light of said first and second intensity is pulsed during said exposure so that upon development, a first optically readable information track comprised of information areas situated alternately at a higher level and at a lower level is formed in said second layer due to the exposure thereof with said pulsed laser light of said first intensity level and a second information track comprised of information areas situated alternately at a higher level and a lower level is formed in said first layer due to exposure thereof with said pulsed laser light of said second intensity level.

* * * * *